United States Patent [19]

Barron et al.

[11] Patent Number: 5,760,462

[45] Date of Patent: Jun. 2, 1998

[54] METAL, PASSIVATING LAYER, SEMICONDUCTOR, FIELD-EFFECT TRANSISTOR

[75] Inventors: Andrew R. Barron, Cambridge, Mass.; Phillip P. Jenkins, Cleveland Heights, Ohio; Andrew N. MacInnes, Quincy, Mass.; Aloysius F. Hepp, Bay Village, Ohio

[73] Assignees: President and Fellows of Harvard College, Cambridge, Mass.; TriQuint Semiconductor, Inc., Beaverton, Oreg.

[21] Appl. No.: 820,183

[22] Filed: Mar. 19, 1997

Related U.S. Application Data

[63] Continuation of Ser. No. 369,364, Jan. 6, 1995, abandoned.

[51] Int. Cl.$^6$ .............................. H01L 23/58; H01L 29/78
[52] U.S. Cl. ........................ 257/629; 257/631; 257/632; 257/410; 438/38; 438/958
[58] Field of Search ............................. 257/410, 411, 257/631, 632, 629–652; 438/38, 958

[56] References Cited

U.S. PATENT DOCUMENTS

| | | | |
|---|---|---|---|
| 4,095,011 | 6/1978 | Hawrylo et al. | 428/469 |
| 4,320,178 | 3/1982 | Chemla et al. | 25/631 |
| 4,354,198 | 10/1982 | Hodgson et al. | 25/631 |
| 4,477,311 | 10/1984 | Mimura et al. | 156/643 |
| 4,774,205 | 9/1988 | Choi et al. | 437/59 |
| 4,811,077 | 3/1989 | Fowler et al. | 257/631 |
| 4,839,145 | 6/1989 | Gale et al. | 422/245 |
| 4,935,384 | 6/1990 | Wancass | 257/631 |
| 4,952,527 | 8/1990 | Calawa et al. | 437/107 |
| 5,051,786 | 9/1991 | Nicollian et al. | 257/765 |
| 5,241,214 | 8/1993 | Herbots et al. | 257/649 |
| 5,300,320 | 4/1994 | Barron et al. | 427/249 |
| 5,387,481 | 2/1995 | Radford et al. | 427/126.3 |
| 5,491,449 | 2/1996 | Johnson et al. | 330/269 |

OTHER PUBLICATIONS

Tabib–Azar et al., "Electronic Passivation of n– and p–type GaAs Using Chemical Vapor Deposited GaS." *Appl. Phys. Lett.*, 63(5):625–267, (1993).

Cheng et al., "Submicrometer Self–Aligned Recessed Gate InGaAs MISFET Exhibiting Very High Transconductance," *IEEE Electron Device Letters*, 5(5):169–171, (1984).

Barnard et al., "Double Heterostructure $Ga_{0.47}In_{0.53}As$ MESFETs with Submicron Gates," *IEEE Electron Device Letters*, 9(9):174–176, (1980).

Fricke et al., A New GaAs Technology for Stable FET's at 300° C., *IEEE Electron Device Letters*, 10(12):577–579, (1989).

Carpenter et al., "Schottky Barrier Formation on $(NH_4)_2S$–Treated n– and p–type (100)GaAs," *Appl. Phys. Lett.*, 53(1):66–68, (1988).

Jenkins et al., "Gallium Arsenide Transistors: Realization Through a Molecularly Designed Insulator," *Science*, 263:1751–1753, (1994).

Nomura et al. "Preparation of $CuIn_5S_8$ Thin Films by Single–Source Organometallic Chemical Vapour Deposition," *Thin Solid Films*, 209:145–147, (1992).

Nomura et al., "Preparation and Characterization of n– and i–Butylindium Thiolate," *Polyhedron*, 8(6):763–767, (1989).

(List continued on next page.)

*Primary Examiner*—David B. Hardy
*Attorney, Agent, or Firm*—Hamilton, Brook, Smith & Reynolds, P.C.

[57] ABSTRACT

A majority carrier device includes a bulk active region and a thin-film passivating layer on the bulk active region. The thin-film passivating layer includes a Group 13 element and a chalcogenide component. In one embodiment, the majority carrier device is a metal, passivating layer, semiconductor, field-effect transistor. The transistor includes an active layer and thin-film passivating layer on the active layer. The thin-film passivating layer includes a Group 13 element and a chalcogenide component. Source and drain contacts are disposed on the active layer or the passivating layer. A gate contact is disposed on the passivating layer between the source contact and the drain contact.

31 Claims, 3 Drawing Sheets

OTHER PUBLICATIONS

Sandroff et al. "Structure and Stability of Passivating Arsenic Sulfide Phases on GaAs Surfaces." *J. Vac. Sci. Technol. B*, 7(4):841–844. (1989).

Wang et al., "Surface Passivation of GaAs with $P_2S_5$–Containing Solutions." *J. Appl. Phys.*, 71(6):2746–2756. (1992).

Turco et al., Thermal and Chemical Stability of Se–Passsivated GaAs Surfaces. *J. Vac Sci. Technol. B*, 8(4):856–859. (1990).

Ueno et al., "Hetero–Epitaxy of Layered Compound Semiconductor GaSe Onto GaSe Onto GaAs Surfaces for Very Effective Passivation of Nanometer Structures." *Surface Science*, 267:43–46, (1992).

Besser et al., "Comparison of Surface Properties of Sodium Sulfide and Ammonium Sulfide Passivation of GaAs." *J. Appl. Phys.*, 65(11):4306–4310. (1989).

Tao et al., "S–Passivated InP (100)–(1x1) Surface Prepared By a Wet Chemical Process." *Appl. Phys. Lett.*, 60(21):2669–2671. (1992).

Nomura et al., "Single–Source Organometallic Chemical Vapour Deposition Process for Sulphide Thin Films: Introduction of a New Organometallic Precursor Bu"In(SPr$^i$)$_2$ and Preparation of $In_2S_3$ Thin Films." *Thin Solid Films*, 198:339–345, (1991).

Power et al., "Interaction of Tris–*tert*–butylgallium with Elemental Sulfur, and Tellurium." *Organometallics*, 11(3):1055–1063. (1992).

MacInnes, A.N., et al., "Enhancement of photoluminescence intensity of GaAs with cubic GaS chemical vapor deposited using a structurally designed single–source precursor." *Appl. Phys. Lett.*62(7):711–713 (Feb. 1993).

Sandroff et al., "Electronic Passivation of GaAs Surfaces Through . . . ". Appl. Phys. Lett. 54(4), 23 Jan. 1989, pp. 362–364.

Iyer et al., "Sulfur as a Surface Passivation for InP" Appl. Phys. Lett. 53(2), 11 Jul. 1988, pp. 134–136.

Geib, K.M., et al., "Formation of S–GaAs Surface Bonds." *J. Vac. Sci, Technol. B*, 8:838–842 (1990).

Cheng et al., "Silicon Oxide Enhanced Schottky Gate $In_{0.53}Ga_{0.47}As$ FET's with a Self–Aligned Recessed Gate Structure." *IEEE Electron Device Letters*, 5(12):511–514 (1984).

Lile, D.L., "The Effect of Surface States on the Characteristics of MIS Field Effect Transistors." *Solid State Electronics*, 21:1199–1207 (1978).

Yamaguchi et al., "Theoretical Characterization and High–Speed Performance Evaluation of GaAs IGFET's" *IEEE Electron Device Letters*, 28(5):581587 (1981).

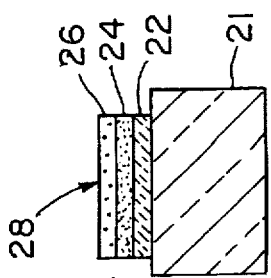
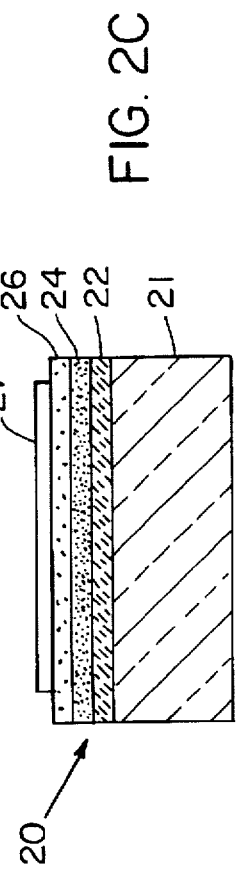
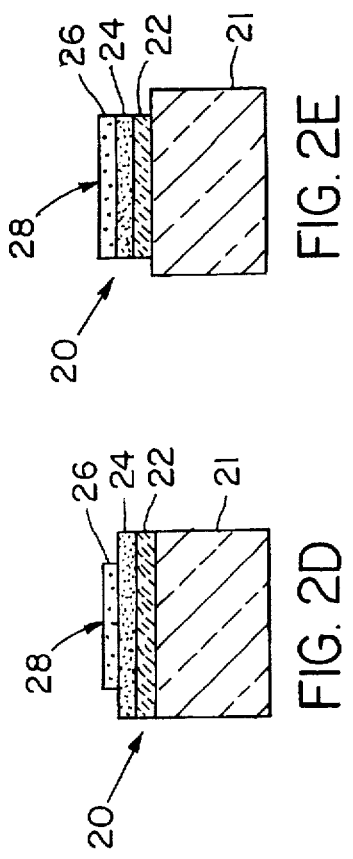
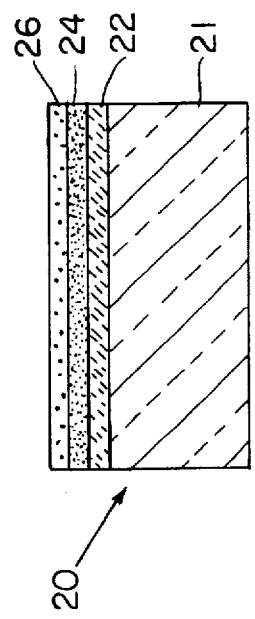
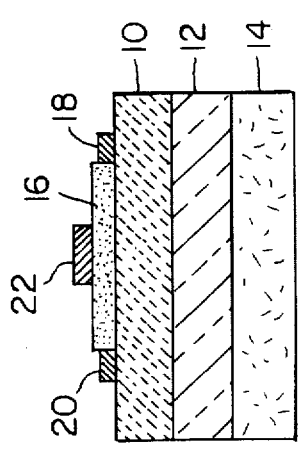
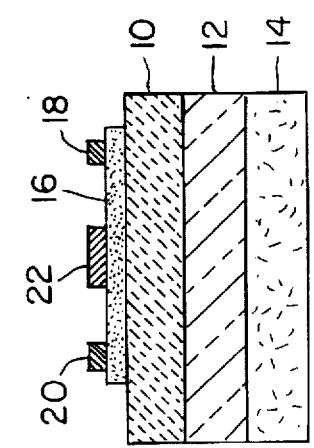
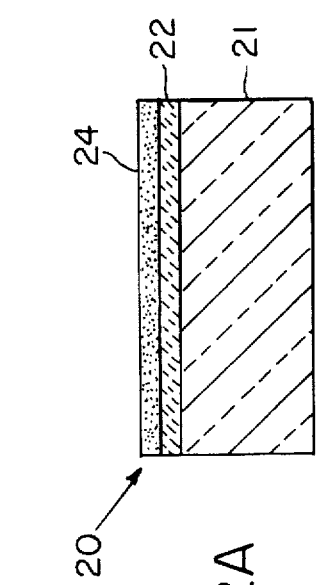

METAL, PASSIVATING LAYER, SEMICONDUCTOR, FIELD-EFFECT TRANSISTOR

This application is a continuation of application Ser. No. 08/369,364 filed Jan. 6, 1995, now abandoned which is incorporated herein by reference in its entirety.

GOVERNMENT FUNDING

This invention was sponsored by NSF Grant No. CHE-9222498 and ONR Contract Numbers N00014-91-J-1934 and N00014-94-I-0609 and the government has certain rights to the invention.

BACKGROUND OF THE INVENTION

Gallium arsenide (GaAs) has over the last decade has become the semiconductor material of choice in a number of applications: for example, optoelectronics (lasers and light-emitting diodes (LEDs) for optical communications and consumer electronics), microwave monolithic integrated circuits (MIMICs) (used in wireless communications such as cellular telephones), and very high frequency analog and digital signal-processing circuits (used for high-data rate real-time processing). However, except for specialty, primarily military, applications, GaAs has been unable to compete with silicon technology in the area of digital electronics.

At present, logic circuits, such as those used in the central processing unit of a modern personal computer, are based on silicon complimentary metal-oxide-semi-conductor (CMOS) circuits, the basic component of which is a metal-oxide-semiconductor field-effect transistor (MOSFET).

Present GaAs FET devices are metal-semiconductor FETs (MESFETs), which, while faster than silicon MOSFETs, suffer from several drawbacks. First, MESFETs consume more power than metal-insulator-semiconductors FETs (MISFETs). The undesirable power consumption is one of the barriers to very large scale integration (VLSI) of GaAs-based circuits. Second, the lack of any insulator between the gate and the channel results in large current conduction through the gate electrode. To circumvent the problems of current leakage across the gate, device architects must implement highly intricate and complex circuit designs. Because both of these problems are inherent in MESFET devices and are not readily solved, the entry of GaAs into the mainstream of high-performance digital electronics has been inhibited.

Therefore, a need exists for majority carrier devices which overcome or minimize the above-referenced problems.

SUMMARY OF THE INVENTION

The present invention relates to a majority carrier device and, in particular, a metal, passivating layer, semiconductor, field-effect transistor.

The majority carrier device includes a bulk active region and a passivating layer on the electrically active region. The passivating layer includes a Group 13 element and a chalcogenide component.

The metal, passivating layer, semiconductor, field-effect transistor includes an active layer and a thin-film passivating layer on the active layer. The thin film passivating layer includes a Group 13 element and a chalcogenide component. A source contact and a drain contact are disposed on the active layer or on the passivating layer. A gate contact is disposed on the passivating layer between the source contact and the drain contact.

This invention has many advantages. For example, the majority carrier devices of the present invention are up to about six times faster and consume less power than known silicon-based semiconductor devices. Also, the metal, passivating layer, semiconductor, field-effect transistors of the present invention exhibit significantly reduced current conduction through the gate contact than do known MESFETS.

Further, these devices have isolation between the gate circuit and the source-drain circuit superior to that of GaAs MESFETs of comparable geometry. In contrast, the lack of any insulator between the gate and the channel in MESFETs results in large current conduction through the gate electrode. Our data demonstrate a GaAs MISFET with good transconductance and input-to-output isolation and acceptable direct current characteristics. A further advantage of cubic GaS lies in its method of growth, MOCVD, an established method of growth of GaAs-based devices. Thus, the ability to grow a gate insulator layer by existing methodology is a distinct advantage of cubic GaS as a potentially viable material for the enablement of GaAs digital devices. This cubic GaS insulating phase should make it possible to design new types of III-V-based devices.

BRIEF DESCRIPTION OF THE DRAWINGS

FIGS. 1A and 1B are cross-sections of majority carrier devices, namely, metal, passivating layer, semiconductor, field-effect transistors, of the present invention.

DETAIL DESCRIPTION OF THE INVENTION

Figure 2F:
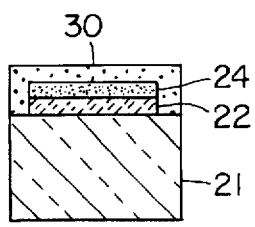
FIGS. 2A through 2N are cross sections of an n-channel, deposition mode GaAs transistor of the invention shown at various stages of fabrication.

The features and other details of the invention, either as steps of the invention or as combinations of parts of the invention, will now be more particularly described and pointed out in the claims. It will be understood that the particular embodiments of the invention are shown by way of illustration and not as limitations of the invention. The principal features of the invention may be employed in various embodiments without departing from the scope of the invention.

The present invention is a majority carrier device that includes an electrically active region and a thin-film passivating layer. The thin-film passivating layer includes a Group 13 element and a chalcogenide component. The chalcogenide component is selected from the group consisting of sulfur, selenium, and tellurium. An example of a majority carrier device of the invention is a field-effect transistor.

A cross section of a specific embodiment of the present invention is represented by FIG. 1A, which depicts a metal, passivating layer, field-effect transistor. The metal, passivating layer, field-effect transistor includes active layer 10. In one embodiment, the active layer is a semiconductor. Active layer 10 is formed of a suitable material, such as n-type gallium arsenide, indium phosphide, silicon, zinc selenide, etc. Active layer 10 can include a doping agent. Examples of suitable doping agents include elements, or compounds which include elements, which are selected from Groups 13, 14 and 15 of the Periodic Table. In one embodiment, the doping agent can be distributed asymmetrically in active layer 10. Doping or some other suitable method can be employed to determine whether a current can flow between a source and drain contact of the transistor in the absence of an applied voltage across a gate contact of the transistor.

Active layer 10 is disposed on buffer layer 12. Examples of suitable buffer layer materials include undoped gallium arsenide, silicon, indium phosphide, etc. Buffer layer 12, in turn, is disposed on isolating substrate 14. Examples of a suitable isolating substrate materials are gallium arsenide, quartz, diamond and sapphire.

Thin-film passivating layer 16 is disposed on active layer 10. Thin-film passivating layer 16 includes a Group 13 element and a chalcogenide component. The chalcogenide component is selected from the group consisting of sulfur, selenium and tellurium. Preferably, thin-film passivating layer 16 is formed of a cubic-phase material. An example of a suitable cubic-phase material is gallium sulphide. In one embodiment, thin-film passivating layer 16 is an insulating layer. Alternatively, thin-film passivating layer 16 is a buffer layer.

Source contact 18 and drain contact 20 are disposed on active layer 10. Gate contact 22 is disposed on thin-film passivating layer 16 between source contact 18 and drain contact 20. In one embodiment, gate contact 22 is a Schottky barrier gate contact. Alternatively, source contact 18, drain contact 20 and gate contact 22 are all disposed on thin-film passivating layer 16, as shown in FIG. 1B. In this embodiment the metallization of gate contact 22 is different than that of source contact 18 and drain contact 20.

The source, drain and gate contacts can include gold. In one embodiment, at least one of the contacts includes a gold-based alloy. In another embodiment, at least one of the contacts includes tungsten silicide.

The majority carrier device is formed by a suitable method. For example, the active layer of the majority carrier device can be formed by molecular beam epitaxy, CVD, etc. The passive layer can be formed by the method described in U.S. Pat. No. 5,300,320, issued to Barron et al. on Apr. 5, 1994, the entirety of the teachings of which are incorporated herein by reference. In general, the methods of forming majority carrier devices of the invention can employ the teachings of U.S. Pat. No. 5,241,214, and U.S. Pat No. 4,774,205, the teachings of which are incorporated herein by reference in their entirety.

The following is an example of one embodiment of a method for forming a metal passivating layer semiconductor field-effect transistor of the invention and, in particular, for making an n-channel, depletion mode, GaAs transistor with the following dimensions; 200 micron wide by 5 micron long gate on a 200 by 400 micron mesa. The following instructions are illustrated showing a side view of each critical step in FIGS. 2A through 2N. The illustrations show the steps for creating a transistor with a gate electrode.

1) Start with a semi-insulating GaAs wafer 20 with an epitaxially grown, 5000 Angstrom thick n-type GaAs layer 22 grown on the top surface of a semi-insulating GaAs substrate 21. Deposit a 500 Angstrom layer 24 of cubic-GaS on the surface of the n-type layer as shown in FIG. 2A.

2) Degrease wafer 20 for 2 minutes in each of the following solvents; trichloroethylene, acetone and propanol, followed by a 5 minute deionized water rinse.

3) spin on a positive photoresist such as Shipley 1350 photoresist for 30 seconds at 5000 RPM and soft bake at 90° C. for 30 minutes to form-photoresist layer 26, shown in FIG. 2B.

4) Expose the photoresist using mask 27, shown in FIG. 2C, to define device mesas 28, shown in FIG. 2D.

5) Develop the photoresist and hard bake at 115° C. for 30 minutes.

6) Etch mesas steps of approximately 7500 Angstroms so that all of the mesas on the wafer are electrically isolated from one another (e.g. etched beyond the 5000 Angstrom n-type layer down to the semi-insulating substrate), as shown in FIG. 2E. A typical etch may consist of $H_3PO_4$:30% $H_2O_2$:$H_2O$, 3:1:25, for 5 minutes at room temperature.

7) Remove photoresist layer 26 in acetone.

8) Spin on and bake photoresist layer 30 suitable for lift-off metallization, as shown in FIG. 2F.

Figure 2J:
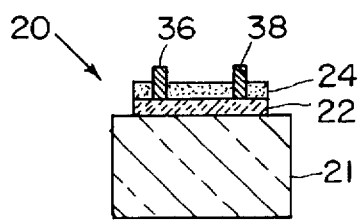
Figure 2G:
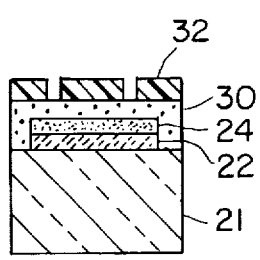

9) Expose photoresist layer 30 for source and drain contacts using pattern 32, as shown in FIG. 2G.

10) Develop photoresist layer 30.

Figure 2K:
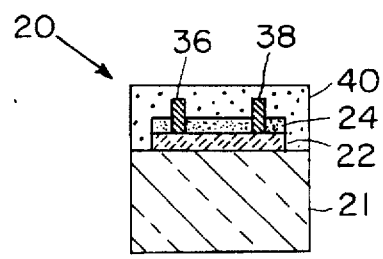
Figure 2H:
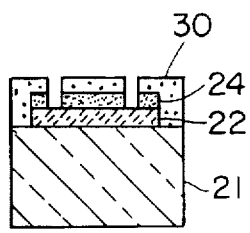

11) Remove the GaS where the source and drain contacts have been defined by etching in $H_3PO_4$ (the etch rate can vary for different GaS layers and should be determined empirically by etching on a sample piece of GaS/GaAs), as shown in FIG. 2H.

Figure 2L:
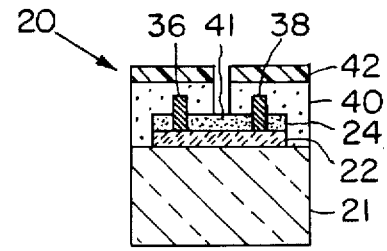
Figure 2I:
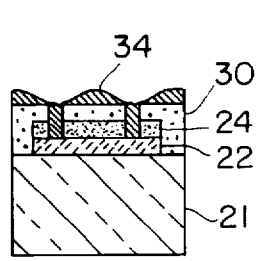

12) Evaporate successive layers of Ni:Ge:Au: 100:250:2000 Angstroms to form metallization layer 34, shown in FIG. 2I.

13) Lift off the photoresist to form drain contacts 36, 38, shown in FIG. 2J.

14) Anneal the contacts for 4 minutes at 430° C. in flowing dry nitrogen.

15) Spin on and bake photoresist layer 40 suitable for lift-off metallization, as also shown in FIG. 2K.

16) Expose photoresist layer 40 to define gate contact 41 using mask 42, shown in FIG. 2L.

17) Develop photoresist layer 40. (Some care should be taken to optimize the photoresist development in order to minimize the exposure of the GaS layer to the developer.)

Figure 2M:
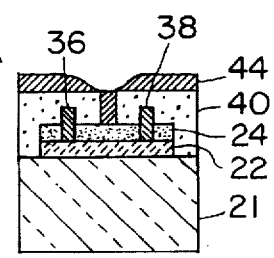

18) Evaporate 2000 Angstrom layer of gold to form gold layer 44, shown in FIG. 2M.

Figure 2N:
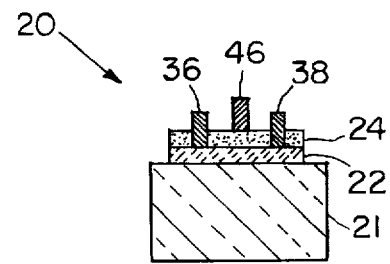

19) Lift off photoresist layer 40 to form gate contacts 46, as shown in FIG. 2N.

Figure 3A:
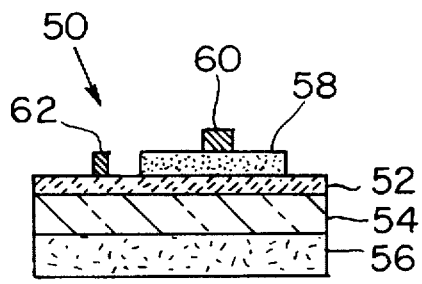
FIGS. 3A and 3B are cross-sections of major carrier devices of the present invention which are Schottky barrier devices.
Figure 3B:
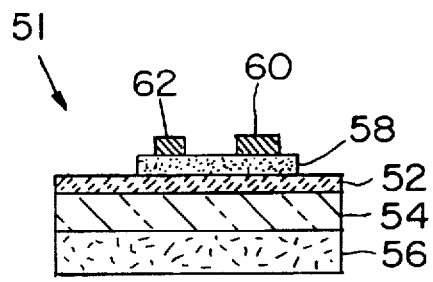

An alternative embodiment of the present invention is a Schottky barrier device, shown in FIGS. 3A and 3B. Schottky barrier devices 50, 51 include active layer 52 on buffer layer 54. Buffer layer 54, in turn, is disposed on isolating layer 56. Active layer 52, buffer layer 54 and isolating layer 56 can all be made of the same types of material employed to form their respective counterparts disclosed with respect to the embodiment shown in FIGS. 1A and 1B. Thin film passivating layer 58 is disposed on active layer 52 and includes a Group 13 element and a chalcogenide component. Schottky barrier gate contact 60 is disposed on thin film passivating layer 58. In one embodiment, electrical contact 62 is located on active layer 52, as shown in FIG. 3A. Alternatively, electrical contact 62 is located on thin film passivating layer 58, as shown in FIG. 3B. Electrical contact 62 is formed of a suitable material, such as a suitable material selected from those described with reference to the source and drain contacts of FIGS. 1A and 1B. Schottky barrier gate contact 60 is also formed of a suitable material, such as is known in the art. Schottky barrier device 50 can be formed by a suitable method, such as that generally described with reference to FIGS. 2A through 2N.

The invention will now be further and specifically described by the following examples. All parts and percentages are by weight unless otherwise specified.

EXAMPLE

Deposition of a cubic GaS thin film was performed in an atmospheric-pressure horizontal-flow hot-walled MOCVD chamber, as described in U.S. Pat. No. 5,300,320. Argon was used as a carrier gas, the precursor ((t-Bu)GaS)$_4$ was sublimed at 220° C., and the substrate was heated to 390° C. A film of GaS 500 Å thick was grown on a previously prepared epilayer and subsequently etched to 300 Å. The epilayer consisted of a 0.5 μm layer of n-type GaAs (Si-doped, N$_D$=4×10$^{16}$ cm$^{-3}$) grown on 0.8 μm of undoped GaAs, which acted as a buffer region to a semi-insulating GaAs substrate as shown in FIG. 1 and as described in Jenkins et al., Science, Vol. 263, pages 1751–1753(1994), the teachings of which are incorporated herein by reference in their entirety. Both the active and buffer regions were grown by molecular beam epitaxy. The cubic GaS grows on (100) GaAs in a near-epitaxial manner, as described in MacInnes et al., Applied Physics Lett., Vol. 62, page 711 (1993), the teachings of which are incorporated in their entirety, such that only the (200) and (400) reflections were observed by x-ray diffraction. The individual FET devices were isolated by mesa-etching, whereas contact photolithography was used to define the device mesas as well as the source, drain, and gate contacts. The GaS was removed from the source and drain contact areas before metallization by acid etching. The devices had a 5-μm-long gate, and gold was used as the gate metal. The device processing yield was about forty percent. Failure of the gate metal to stick to the GaS was the main processing failure. To obtain the necessary parameters of the channel (such as mobility and channel depth) and provide a direct comparison between our GaS-GaAs FET and a standard GaAs MESFET, both devices were fabricated using identical procedures and masks. Both types of device were characterized by capacitance (C) versus voltage (V) and current (I) versus voltage measurements.

Figure 4:
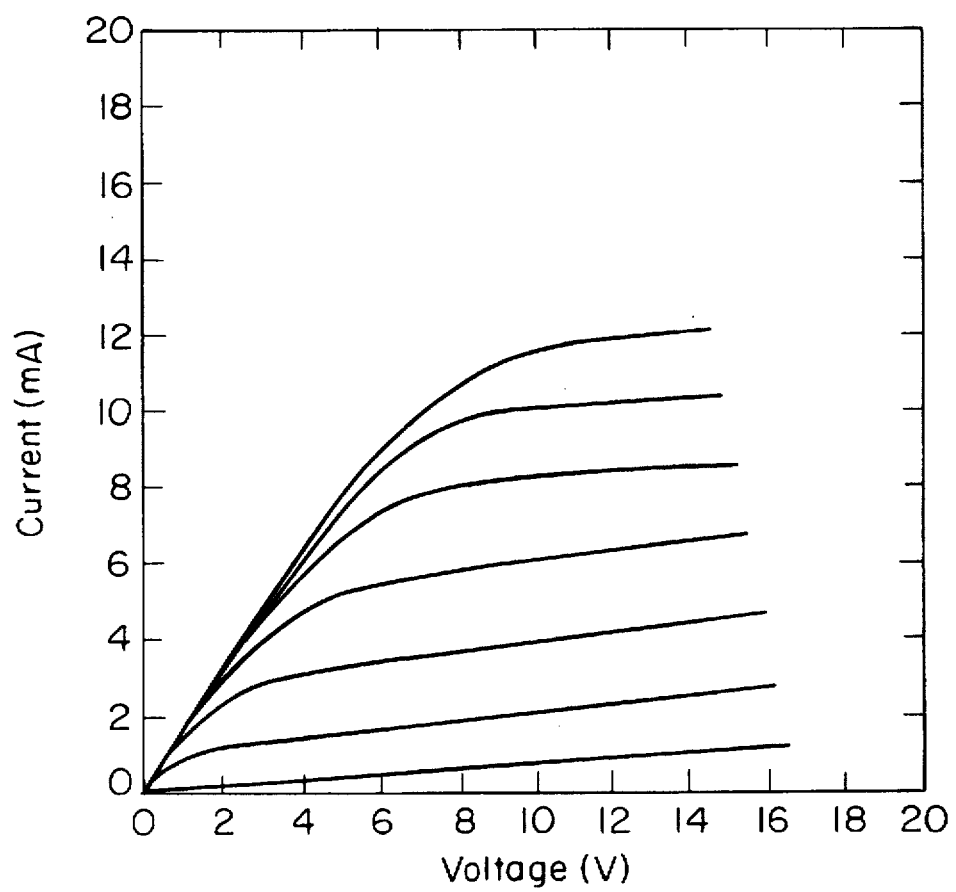
FIG. 4 is a plot of drain-to-source current ($I_{DS}$) as a function of the drain-to-source voltage ($V_{DS}$) at various gate biases ($V_g$, 1V per step) for a metal passivating layer semiconductor field effect transistor of the present invention.

The behavior of the drain-to-source current versus voltage ($I_{DS}$–$V_{DS}$) curves at different applied gate voltages ($V_g$), shown in FIG. 4, are close to that of an ideal transistor. The transconductance of the transistor shown in FIG. 4 at $V_{DS}$=8 V and $V_g$=5 V is 7 mS. This value was calculated from the data in FIG. 4, taking into account the series resistances of the drain-gate and source-gate paths by standard procedures. Additionally, a channel mobility of 4665.6 cm$^2$V$^{-1}$s$^{-1}$ was determined, comparable to the values for MESFETs and near the textbook value for GaAs (4700 cm$^2$ V$^{-1}$ s$^{-1}$) The transistor characteristics shown in FIG. 4 were typical of those obtained from the better of the GaS-GaAs FETs fabricated, the worst having values for the transconductance about fifty percent of the above values, the best being around 20 mS.

By comparing the $I_{DS}$–$V_{DS}$ curves for the GaS-GaAs FETs and the GaAs MESFETs, we determined that there existed an effective negative charge density (10$^{-6}$ Ccm$^{-2}$) at the GaS-GaAs interface in the former. As a consequence, the transistor threshold voltage obtained for the GaS-GaAs FETs was −6 V (extrapolated to $V_{DS}$=0 V).

To obtain information regarding the GaS gate insulator, we performed high-frequency (100-kHz) C–V measurements on the Au-GaS-GaAs structure. The resistivity of the GaS (≈10$_9$ ohm.cm) was comparable to our previously measured values (2×10$^9$ ohm.cm (18)), and the maximum interface trap density ($D_{it}$) was 9×10$^{10}$ eV$^{-1}$ cm$^{-2}$. This interface trap density, although acceptable from the device operation point of view, could have been improved with a decrease in imperfections in the GaS film. The gate capacitance was ≤1.6 pF, consistent with 300 Å GaS with a relative dielectric constant of 11.

Equivalents

Those skilled in the art will recognize, or be able to ascertain using no more than routine experimentation, many equivalents to the specific embodiments of the invention described specifically herein. Such are intended to be encompassed by the following claims.

We claim:

1. A majority carrier device, comprising:
   (a) an electrically active region; and
   (b) a thin-film passivating layer of greater than monolayer thickness in contact with said active region, said thin-film passivating layer consisting essentially of a Group 13 element and a tellurium.

2. A metal passivating layer semi-conductor field effect transistor comprising:
   (a) an active layer;
   (b) a thin-film passivating layer of greater than monolayer thickness in contact with the active layer, said thin-film passivating layer consisting essentially of a Group 13 element and a chalcogenide component;
   (c) a source contact on the active layer or on the passivating layer;
   (d) a drain contact on the active layer or on the passivating layer;
   (e) a gate contact on the passivating layer and between the source contact and the drain contact.

3. The transistor of claim 2, wherein the active layer includes at least one doping agent.

4. The transistor of claim 3, wherein the doping agent is distributed asymmetrically within the active layer.

5. The transistor of claim 4 wherein the doping agent is element select from Group 13 or Group 15 of the Periodic Table.

6. The transistor of claim 2, wherein the active layer is a semi-conductor.

7. The transistor of claim 2, wherein the active layer includes gallium arsenide.

8. The transistor of claim 2, wherein the active layer includes silicon.

9. The transistor of claim 2, wherein the active layer includes indium phosphide.

10. The transistor of claim 2, wherein the active layer includes zinc selenide.

11. The transistor of claim 2, wherein said transistor includes a Schottky barrier gate contact.

12. The transistor of claim 2, wherein at least one of the contacts includes gold.

13. The transistor of claim 12, wherein at least one of the contacts includes a gold-based alloy.

14. The transistor of claim 2, wherein at least one of the contacts includes tungsten silicide.

15. The transistor of claim 2, wherein the passivating layer is an insulating layer.

16. The transistor of claim 2, wherein the passivating layer is a buffer layer.

17. The transistor of claim 2 further including a buffer layer at the active layer.

18. The transistor of claim 2, wherein the chalcogenide component of the thin-film passivating layer includes sulfur.

19. The transistor of claim 2, wherein the chalcogenide component of the thin-film passivating layer includes selenium.

20. The transistor of claim 2, wherein the chalcogenide component of the thin-film passivating layer includes tellurium.

21. The transistor of claim 2, wherein the electrically active region includes a p-type doped region and a n-type doped region.

22. The transistor of claim 2, wherein the portions of the electrically active layer proximate to the source and drain contacts are of opposite conductivity types.

23. The transistor of claim 2, wherein current can flow between the source and drain contacts in the absence of an applied voltage across the gate contact.

24. The transistor of claim 2, wherein current cannot flow between the source and drain contacts in the absence of an applied voltage across the gate contact.

25. The transistor of claim 2, wherein the thin film passivating layer is an isolation layer between the gate, source and drain contacts.

26. A Schottky barrier device, comprising:
 a) an electrically active layer;
 b) a thin-film passivating layer of greater than monolayer thickness in contact with the active layer, said thin film passivating layer consisting essentially of a Group 13 element and a chalcogenide component;
 c) an electrical contact on the active layer or on the passivating layer; and
 d) a Schottky barrier gate contact on the passivating layer.

27. The transistor of claim 17 wherein the buffer layer is disposed a substrate.

28. The transistor of claim 27, wherein the substrate includes gallium arsenide.

29. The transistor of claim 27 wherein the substrate includes quartz.

30. The transistor of claim 27 wherein the substrate includes diamond.

31. The transistor of claim 27 wherein the substrate includes sapphire.

* * * * *

UNITED STATES PATENT AND TRADEMARK OFFICE
CERTIFICATE OF CORRECTION

| | |
|---|---|
| PATENT NO. : | 5,760,462 |
| DATED : | June 2, 1998 |
| INVENTOR(S) : | Andrew R. Barron, Phillip P. Jenkins, Andrew N. MacInnes and Aloysius F. Hepp |

It is certified that error appears in the above-identified patent and that said Letters Patent is hereby corrected as shown below:

Claim 5, line 2, delete "element select" and insert --an element selected--; and
Claim 27, line 2, delete "disposed" and insert --disposed upon--.

Signed and Sealed this

First Day of September, 1998

*Attest:*

BRUCE LEHMAN

*Attesting Officer*       *Commissioner of Patents and Trademarks*